United States Patent [19]

Adinolfi et al.

[11] Patent Number: 4,589,817
[45] Date of Patent: May 20, 1986

[54] AUTOMATED COMPONENT HANDLING SYSTEM

[75] Inventors: Philip J. Adinolfi, Columbia; Arthur B. Redpath, Severna Park, both of Md.

[73] Assignee: Westinghouse Electric Corp., Pittsburgh, Pa.

[21] Appl. No.: 582,342

[22] Filed: Feb. 22, 1984

[51] Int. Cl.[4] .............................................. B25J 15/00
[52] U.S. Cl. ................................... 414/729; 414/730; 901/39; 294/116
[58] Field of Search ............... 294/83.3, 83.31, 83.32, 294/83.33, 106, 116; 901/39; 414/729, 730

[56] References Cited

U.S. PATENT DOCUMENTS

| | | | |
|---|---|---|---|
| 2,822,094 | 2/1958 | Greer | 901/39 X |
| 3,583,752 | 6/1971 | Panissidi | 294/88.3 |
| 3,945,676 | 3/1976 | Asamoto | 294/106 X |

FOREIGN PATENT DOCUMENTS

| | | | |
|---|---|---|---|
| 956861 | 4/1964 | United Kingdom | 294/116 |
| 1380034 | 1/1975 | United Kingdom | 294/116 |
| 595145 | 4/1978 | U.S.S.R. | 901/39 X |
| 632563 | 11/1978 | U.S.S.R. | 901/39 X |

Primary Examiner—Terrance L. Siemens
Attorney, Agent, or Firm—W. G. Sutcliff

[57] ABSTRACT

A robotic system for handling components such as wire leads is disclosed. The system includes a multi-axis programmable machine, often referred to as a robot, to manipulate a chuck mechanism to acquire components such as a lead wire for example and position this wire in a desired predetermined location. Typical applications include the insertion of wires having a connector pin into a multi-pin connector.

6 Claims, 6 Drawing Figures

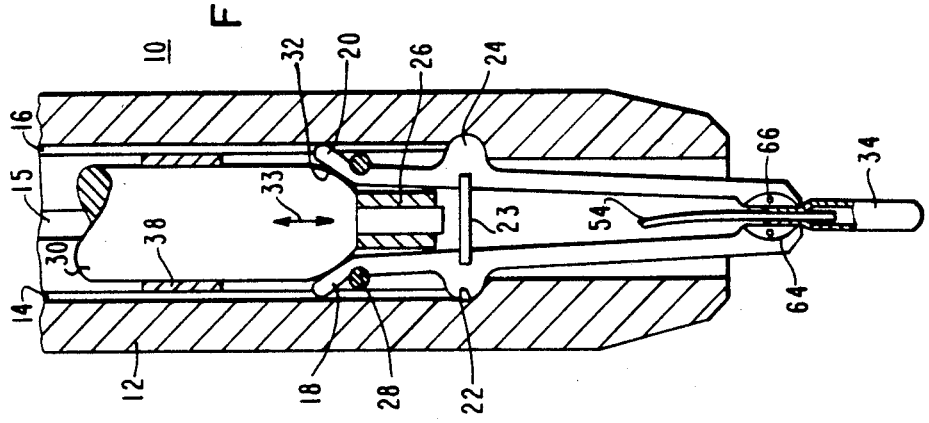
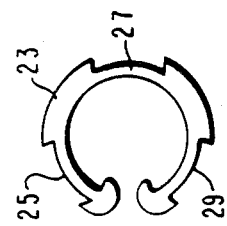
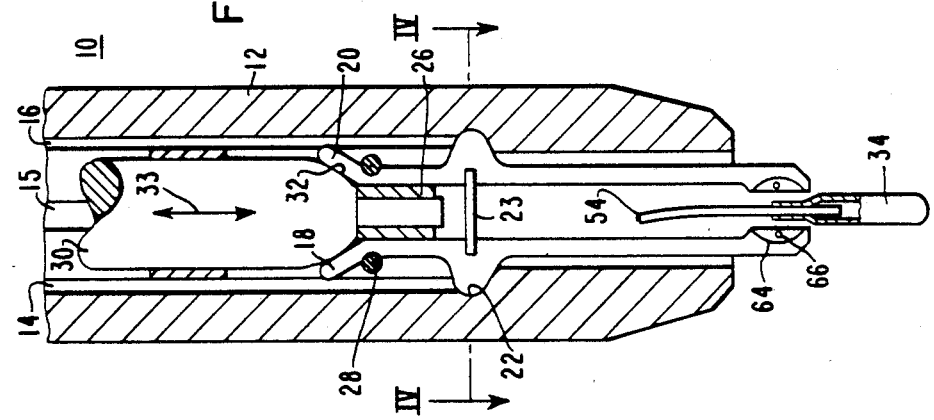

AUTOMATED COMPONENT HANDLING SYSTEM

STATEMENT OF GOVERNMENT INTEREST

This invention was either conceived or reduced to practice under Contract No. F19628-81-C-0101 with the U.S. Government.

BACKGROUND OF THE INVENTION

1. Field of the Invention:

The invention relates to automated component handling systems and more specifically to robotic systems which include a chuck mechanism especially adapted to handle elongated components such as lead wire.

2. Description of the Prior Art:

Prior art chuck-type supporting mechanisms have tended to be rather bulky or cumbersome because of the complexity of the jaw mechanisms. Additionally, the prior art chucks utilized by prior art systems were loaded by sliding the component centrally into the jaws from either end. By contrast, the invention provides a robotic component handling system with a chuck which can be side loaded.

SUMMARY OF THE INVENTION

The preferred embodiment of the invention comprises an automated (mechanized) machine for handling components such as lead wire. The system includes a multi-axis programmable positioner (robot) for positioning and controlling a component handling chuck mechanism to acquire and place a component in the desired location. The component handling chuck mechanism utilizes a plurality of jaws, each of the jaws supported by a housing to rotate through a predetermined angle about a pivot point in response to the movement of a drive cam. As the drive cam moves an opening force is applied to the inner surface of the jaws causing the chuck to open and close as the jaw members rotate about their associated pivot. A first resilient member cooperates with the jaws to apply an opening force to the jaw members. A second resilient member applies an outwardly extending force to each of the jaw members to maintain mechanical contact between the housing and the pivot point of each of the jaws. The drive cam applies a closing force to the inner surface of the jaws such that the closing force selectively exceeds the opening force, thereby causing the jaws to move, closing the chuck. In the open position, sufficient space is provided between at least two adjacent jaw members such that the component to be handled can slide between the jaws to be positioned such that when the jaws are moved to the closed position, the component is supported between the jaws.

BRIEF DESCRIPTION OF THE DRAWINGS

FIG. 1 is a cross-section of the chuck showing the jaws in the open position;

FIG. 2 is a drawing illustrating a jaw retaining ring;

FIG. 3 is a diagram of the invention in cross-section showing the jaws in the closed position;

DESCRIPTION OF THE PREFERRED EMBODIMENT

Figure 4:
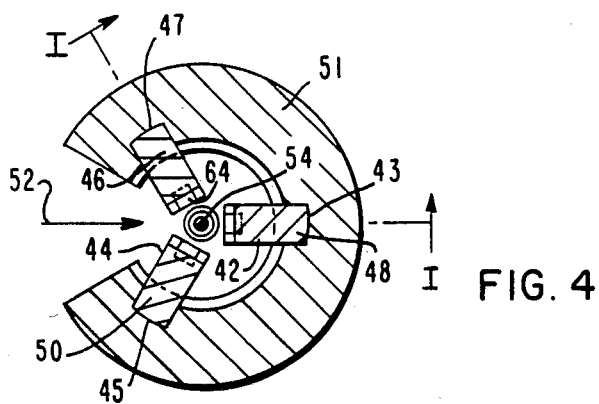
FIG. 4 is a cross-section of the chuck mechanism along section IV—IV.

A chuck mechanism 10 useful in the preferred embodiment of the invention is illustrated in partial cross-section in FIG. 1 along section line I—I (FIG. 4). Structural support for the components comprising the chuck is provided by a housing 12. The housing 12 includes a larger diameter in the upper portion and a smaller diameter in the lower portion. The inner surface of the upper portion of the housing 12 includes grooves for supporting the three jaws, with two of the three grooves illustrated at reference numbers, 14 and 16. Two representative jaws, 18 and 20, are positioned in the grooves, 14 and 16. The jaws, 18 and 20, include outwardly protruding pivot points 22 and 24. A resilient retaining member, such as a "C" ring 23, for example, applies an outwardly extending force to the jaws, 18 and 20, maintaining pivot points, 22 and 24, in contact with housing 12. Positioned between the upper portion of the jaws, 18 and 20, is a guide bushing 26. A resilient member 28, which may be an annular spring or an elastomer O-ring, is positioned around the upper portion of the jaws, 18 and 20, to apply an inward opening force to the jaws, 18 and 20. A closing force for the jaws, 18 and 20, is provided by a drive cam 30 which includes a cone-shaped surface 32. To close the jaws, 18 and 20, to grip a component, such as the wire 34 illustrated in FIG. 1, the drive cam 30 is forced downward along axis 33 causing the cone-shaped surface 32 to contact the inner surface of the outwardly extending end portions of jaw members, 18 and 20. This causes the jaw members, 18 and 20, to rotate through a determinable angle around pivot points, 22 and 24, stretching the annular spring member 28, causing the lower portions of the jaw members, 18 and 20, to close on the wire 34. The drive cam 30 is supported within the housing 12 by one or more bushings with a typical bushing being illustrated at reference number 38.

Resilient ring member 23 is illustrated separately in FIG. 2. A notch, with three typical notches illustrated at reference numbers 25, 27 and 29, is provided for each of the jaw members to restrain the ring member 23 from rotating. A circumference for the resilient member 23 is selected to maintain an outwardly extending force on the jaw members, 18 and 20, which is sufficient to hold the pivot points 22 and 24 in recesses in support member 12. Additionally, each of the jaw members, 18 and 20, includes a notch. When assembled the "C" ring 23 expands, such that its edges extend into the notches in the jaw members 18 and 20. This holds the "C" ring member 23 in the desired position and prevents it from moving relative to the jaw members, 18 and 20, as the chuck is operated (opened and closed). Although only three notches 25, 27 and 29 are illustrated in FIG. 2, the chuck mechanism 12 may be constructed using a greater number or a lesser number of jaws.

FIG. 3 illustrates the chuck mechanism 12 with the jaws, 18 and 20, in the open position. Functionally, the jaws, 18 and 20, are opened by driving the cam 30 upwards along axis 33, thereby reducing or eliminating the force applied to the inner surfaces of the jaw members, 18 and 20. This permits the resilient annular spring member 28 to pull the upper portion of the jaws, 18 and 20, inwardly causing the jaws to rotate slightly about the pivot points, 22 and 24, resulting in the bottom ends or holding portions of the jaws to move outwardly away from and release the component 34.

Suitable methods of driving the cam member 30 include small pneumatic cylinders as well as other linear actuators. Since these drive mechanisms are available in the prior art and the details of their application is obvious, these mechanisms are not included in the illustrations for purposes of simplicity. Additionally, the major function of the portions of the housing 12 which extend below the pivot points, 22 and 24, is to provide mechanical protection for the jaw, 18 and 20. In application where this protection is not desirable, this portion of housing 12 may be removed.

For purposes of illustration and simplicity, the drawings in FIGS. 1 and 3 illustrate two jaws as per the section indicated in FIG. 4. It is contemplated that in its most useful form the chuck will utilize at least three jaws, resulting in the self-centering action to position the component in the center of the chuck mechanism 10.

The chuck mechanism 10 is illustrated in cross-section in FIG. 4 along a line IV—IV (FIG. 1). As can be seen from this figure, the three jaw members 42 and 46, respectively, are positioned in grooves 43, 45 and 47. Additionally, the housing member 51 includes an opening which permits the wire 54 to be slid between the jaw members 46 and 44 when the jaws are in the open position. This opening is not illustrated in FIG. 1 due to the plane I—I along which the cross-section is taken.

Figure 5:
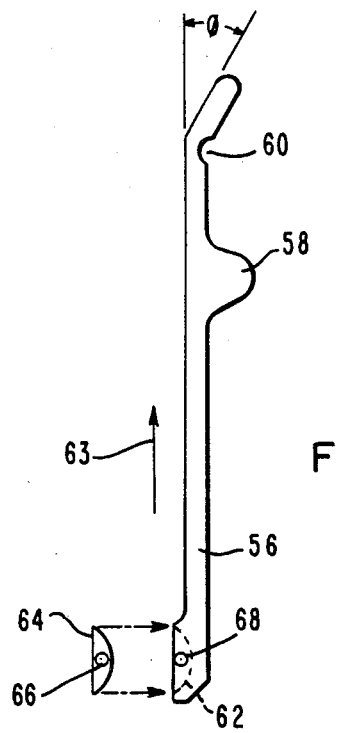
FIG. 5 is a drawing illustrating one of the jaws utilized by the invention.

FIG. 5 is a more detailed view of a typical jaw member 56. As is clearly evident from this view, the outer surface of the jaw member 56 includes an outwardly extending protrusion 58 which serves as the pivot point previously discussed. Additionally, a groove 60 is included in the outer edge of the jaw member to retain the annular spring member 28 (FIG. 1) in the desired position. The first end of the jaw member 56 which is to grip the component includes a small semicircular depression 62. A gripper shoe 64 is designed to be held in the semicircular depressions 62 by a pin which passes through openings 66 and 68 in the shoe 64 and the jaw member 56. The shoe 64 and the groove 62 are shaped to permit the shoe 64 to rotate through a predetermined angle such that the shoe can adapt to the surface of the component being gripped. The second end of the jaw member 56 includes a portion 61 which extends at an angle $\theta$ with respect to the major axis 63 of the jaw member 56. The inner surface of this angled portion 61 contacts the drive cam 30 (FIG. 1) permitting the jaw member of the slutch to be closed.

The chuck mechanism can be made any convenient size, depending on the application. For example, if the chuck is to be used to handle 18 to 20 gage wire, the outer diameter of the housing 51 (FIG. 4) may be in the order of ⅝ inches.

Figure 6:
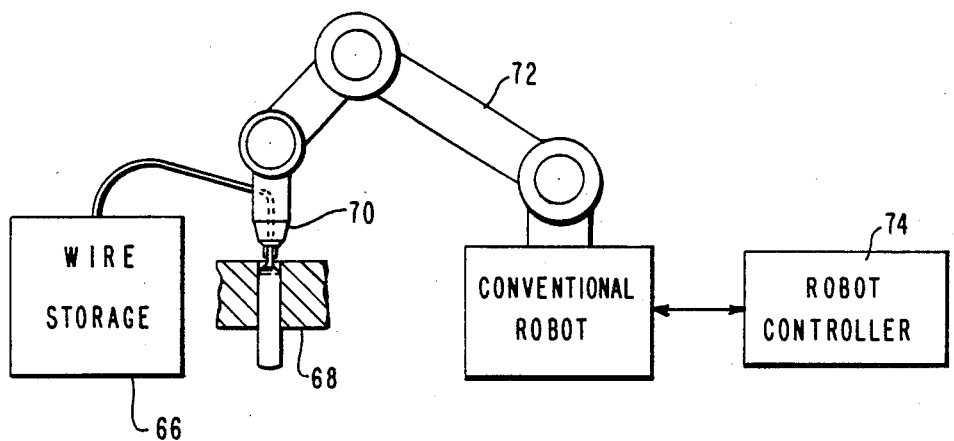
FIG. 6 is a drawing of the system comprising the invention.

FIG. 6 is a generalized view of the entire system comprising the invention. In this embodiment, the system is designed to remove a wire, having a connector pin thereon, from a wire storage bin 66 and insert the pin into an opening in a typical multi-pin connector illustrated functionally using a typical opening for a single pin at reference numeral 68. A chuck mechanism 70 of the type previously discussed is attached to the arm of a conventional multi-axis robot 72. The robot 72 is controlled by a robot controller 74 which may also be of conventional design. In operation, the robot 72 is programmed to move the wire from the storage bin 66 where suitable mechanisms are included to position the connector pin and the attached wire in the jaws of the chuck which are open as shown in FIG. 2. Then the robotic controller 94 closes the jaws to grip the connector moving the drive cam 30 to the downward position as indicated in FIG. 1. Then the robot moves the wire and the attached connector pin to the position indicated in FIG. 5 and inserts the connector pin into the connector 68 as indicated in FIG. 5. This operation is sequentially repeated until the proper number of connector pins have been inserted into the connector 68. After the desired number of leads has been inserted into the connector 68, the connector is removed from the robot using any convenient means and the cycle repeated to assemble other additional connectors.

Although the system has been described with respect to FIG. 6 and a specific application, the system is not so limited. In fact, the system is applicable to any task within the agility capabilities of the robot 72 and functional capabilities of the chuck 70.

We claim:

1. A component holding chuck useable with mechanized assembly apparatus, having:
    (a) a plurality of jaw members each having interior and exterior edges supported in a housing such that selected portions of said exterior edges of said jaws contact the interior surface of said housing such that said jaw members are rotatable through a determinable angle thereby causing said jaw members to selectively open and close as said jaw members rotate;
    (b) means for applying an outwardly extending force to said interior edges of said jaw members;
    (c) resilient means disposed to apply an opening force to said exterior edges of said jaw members; and
    (d) means for selectively applying a closing force to said jaw members, such that when said closing force exceeds said opening force said jaws close.

2. A robotic component handling system including:
    (a) a multi-axis programmable arm;
    (b) a component handling (gripping) chuck affixed to said multi-axis programmable arm, said chuck including:
        (1) a plurality of jaw members having interior and exterior edges supported by a cylindrical housing having interior and exterior surfaces with selected portions of the interior surface of said housing contacting selected portions of said exterior edges, each of said jaw members being rotatable through a predetermined angle such that said jaws selectively move between open and close positions as said jaw members selectively rotate through said predetermined angle;
        (2) first resilient means disposed to encircle first ends of said jaw members to apply an opening force to said jaw members;
        (3) second resilient means disposed to apply a force to the interior edges of said jaw members to maintain selected portions of said exterior edges of said jaw members in contact with said interior surface of said housing;
    (c) drive cam means reciprocally moving substantially parallel to the major axis of said jaw members to selectively apply a force to said interior edges to drive said jaw members such that they rotate through said predetermined angle thereby causing said jaw members to move between said open and said closed positions; and
    (d) control means to selectively move said programmable arm and for controlling said drive cam means.

3. A system in accordance with claim 2 wherein said cylindrical housing includes a plurality of grooves in its interior wall, said grooves being adapted to cooperate with said jaw members to provide mechanical support to said jaw members.

4. A system in accordance with claim 3 wherein each of said jaw members included a gripping end and a gripping shoe affixed thereto such that said gripping shoe is rotatable through a predetermined angle permitting said gripping shoe to adapt to the surface of the component to be handled.

5. A system in accordance with claim 4 wherein said housing includes an opening therein specifically adapted to permit components to be loaded into said chuck.

6. A system in accordance with claim 2 wherein each of said jaw members includes an outwardly angled upper portion and said drive cam includes an inwardly angled portion, said inwardly angled portion of said drive cam contacting the inner edge of said outwardly angled portion of said jaw member such that when said drive cam reciprocally moves said jaws are opened and closed.

* * * * *